Jan. 27, 1970 D. R. BREUER 3,492,499

DIFFERENTIAL LOW LEVEL COMPARATOR

Filed Oct. 25, 1966 2 Sheets-Sheet 1

David R. Breuer,
INVENTOR.
BY.
James H. Griffin
ATTORNEY.

DIFFERENTIAL LOW LEVEL COMPARATOR

Filed Oct. 25, 1966 2 Sheets-Sheet 2

David R. Breuer,
INVENTOR.
BY.
James H. Griffin
ATTORNEY.

United States Patent Office 3,492,499
Patented Jan. 27, 1970

3,492,499

DIFFERENTIAL LOW LEVEL COMPARATOR

David Roy Breuer, Playa Del Rey, Calif., assignor to TRW Inc., Redondo Beach, Calif., a corporation of Ohio Filed Oct. 25, 1966, Ser. No. 589,393
Int. Cl. H03k 5/20
U.S. Cl. 307—235 1 Claim

ABSTRACT OF THE DISCLOSURE

An electronic circuit responsive to low voltage input signals which eliminates the need for multiplexing or amplifying of the low-level input signals prior to comparison. A separate open loop differential comparator is used for each channel of signals to be compared. Comparison is achieved between a differential reference signal and a differential input signal.

This invention relates to electronic circuits of the type that compare the relative amplitudes of a plurality of input signals; and more particularly there is set forth herein a differential low-level comparator technique for digital data systems.

In the usual digital comparator system, many differential analog signals are handled by a circuit beginning with an analog multiplexer, then an amplifier, and finally a comparator. Since a low-level signal may be as small as 5 mv. full scale and up, the error introduced by first-stage multiplexing may be considerable. To avoid this low-level multiplexing error, it is possible to use one amplifier for each low-level signal input channel and then follow up with a high level multiplexer; but the use of so many operational amplifiers is economically undesirable. The low-level amplifier also adds unnecessary error components.

The main object of this invention is to provide a differential low-level comparator technique which avoids the typical sources of analog multiplexing error, such as leakage currents, voltage offsets, and attenuation and also is independent of high gain closed loop amplifier error problems such as dynamic stability, gain accuracy, and linearity.

In the achievement of the above and other objects and as a feature of this invention there is provided a low-level differential comparator which eliminates the need for multiplexing or amplifying signals prior to comparison. One open loop differential comparator is used per channel of signals to be compared, and comparison is performed by comparing a differential input signal against a differential reference signal at low-level. The comparison signal thus derived is then amplified in an open-loop amplifier to create a digital output. A drift-offset control circuit may be used to compensate for the inherent drift-offset of the comparator input stage, thus providing high accuracy over a wide temperature range; however, this refinement is optional. Since the multiplexing stage follows the comparator, applicant's system features digital multiplexing, thus avoiding analog multiplexing errors.

Figure 1A:
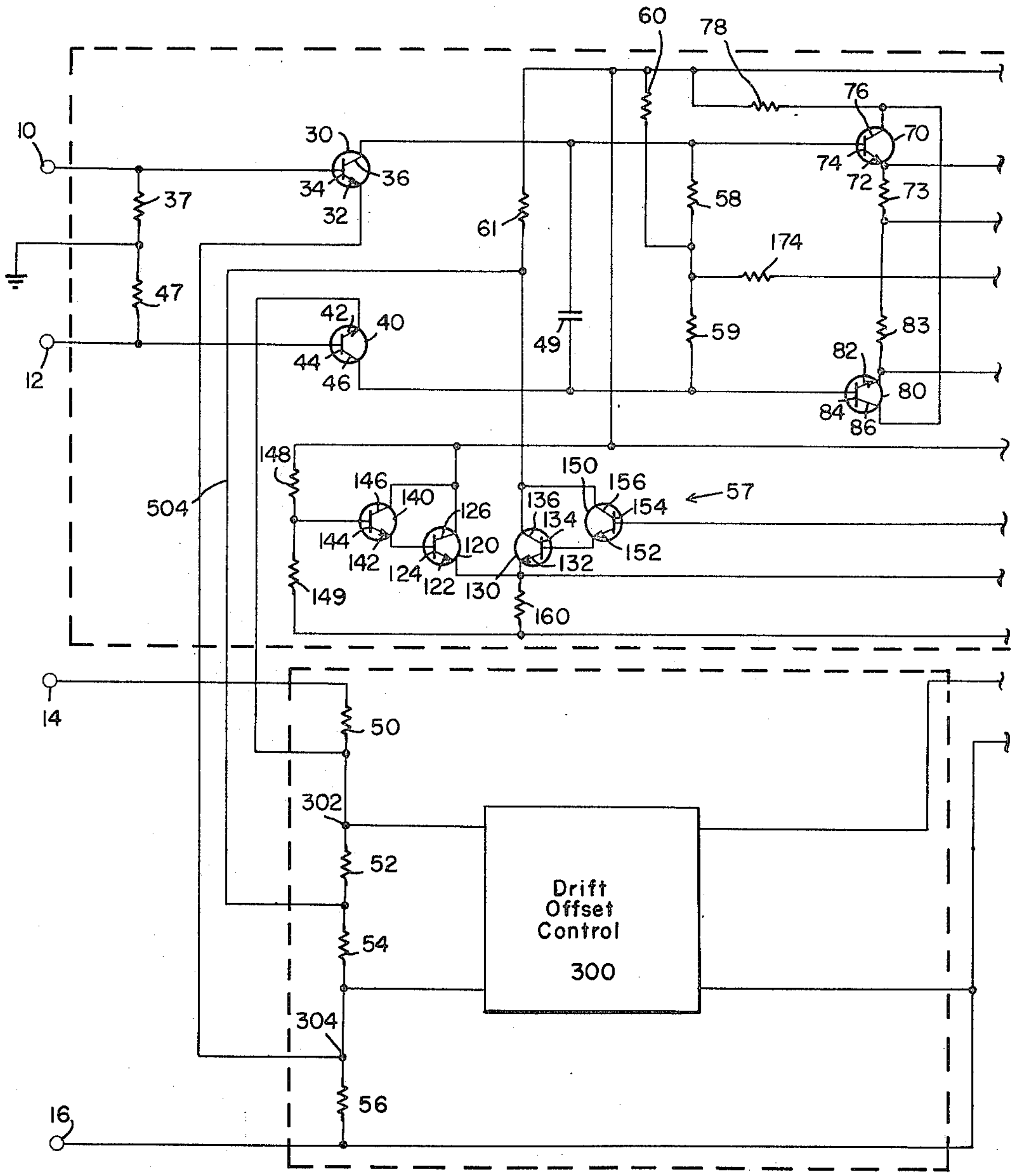
Figure 1B:
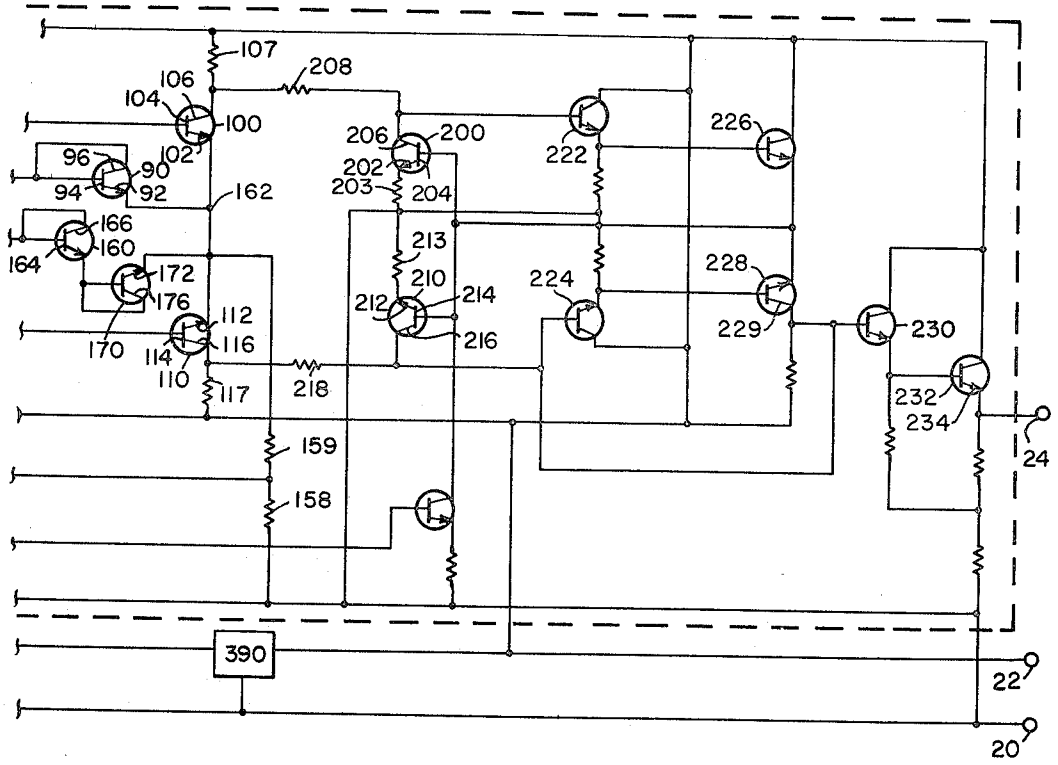
Figure 2:
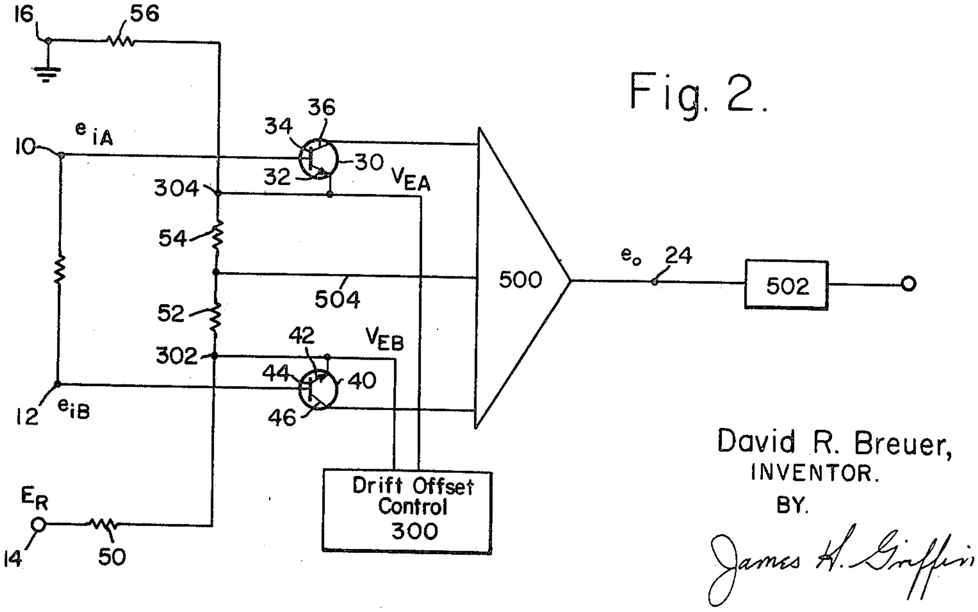

Other objects and features of this invention and a better understanding thereof may be had by referring to the following description and claim, taken in conjunction with the accompanying drawing, in which:

FIGS. 1*a* and 1*b* sets forth a circuit diagram of a preferred embodiment of applicant's invention and;

FIG. 2 shows in schematic form the essential functions performed within the circuits of FIGS. 1*a* and 1*b*.

Referring to FIGS. 1*a* and 1*b*, applicant's preferred circuit embodying the inventive principles described above begins with two input terminals 10 and 12 to which low level analog signals to be compared are applied. Reference signal terminals 14 and 16 are used for introducing reference voltage levels to the circuitry of FIGS. 1*a* and 1*b*, while two terminals 20 and 22 are used for applying negative and positive power, respectively, to the circuitry. An output terminal 24 receives the differentially compared and amplified signal produced by the FIGS. 1*a* and 1*b* circuit.

A low level differential comparator according to the principles of this invention is centered about two active elements or amplifying means such as the transistors 30 and 40, each of which has an input electrode, control electrode, and output electrode. In the case of the transistor 30 the input electrode is an emitter 32, the control electrode is a base 34, and the output electrode is a collector 36. In the case of the transistor 40 the input electrode is an emitter 42, the control electrode is a base 44 and the output electrode is a collector 46. The transistors in the circuit of FIGS 1*a* and 1*b* are shown as NPN transistors, but it is obvious that PNP transistors could be used if only the power supply in biasing arrangements were altered. The base 34 of the transistor 30 is directly connected to the input terminal 10, while the base 44 is directly connected to the input terminal 12. Two resistors 36 and 46 usually equal and large in value, are also connected to the bases 34 and 44; if the signal sources beyond the terminals 10 and 12 are "floating" or not strictly tied to a certain operating voltage level, the resistors 36 and 46 should be grounded or connected to some reference source to assure an input voltage reference and current source.

Four resistors 50, 52, 54, and 56 are connected in series between the reference terminals 14 and 16. The resistors 50 and 56 are preferably equal, and so are the resistors 52 and 54. The emitter 42 is connected between the resistors 50 and 52, the emitter 32 between the resistors 54 and 56. Between the resistors 52 and 54 is a feedback connection to circuitry that will be described in greater detail hereinafter; its general effect on the differential comparator transistors 30 and 40 is to provide stabilized common-mode collector currents.

The output signal of the differential comparison stage appears across the collectors 36–46. High frequency noise in the signal is attenuated through a series capacitor 49. The voltage output signal of the comparison stage is developed across equal load resistors 58 and 59 connected in series across the collectors 36–46. A resistor 60 connected from a point between the load resistors 58 and 59 to the positive power supply delivers current into resistors 58, 59, and 174.

The collector 36 is connected to an emitter-follower transistor 70 having emitter 72, base 74, and collector 76. The base 74, the control electrode of the emitter follower, receives the signal across the resistor 58. The collector 76 is connected through a resistor 78 to the positive power supply. Similarly, the collector 46 is connected to the control electrode of an emitter-follower transistor 80 having emitter 82, base 84, and collector 86.

The emitters 72 and 82 are joined together through two equal resistors 73 and 83, between which is connected a transistor 90 in diode configuration, to provide a controlled source of current.

The output signals of the emitter-followers 70 and 80 appear on their emitters 72 and 82 and are directly coupled to the second voltage amplification stage centered about two transistors 100 and 110, having emitters 102 and 112, bases 104 and 114, and collectors 106 and 116, respectively. The emitters 102 and 112 are joined together, while the collectors are joined to the positive power supply through collector load resistors 107 and

117, respectively. The amplified signals produced by the transistors 100 and 110 appear on their collectors 106 and 116.

Referring in more detail to the common mode feedback circuit mentioned above, at 57, it comprises a Darlington circuit made up of four transistors 120, 130, 140, and 150, having emitters 122, 132, 142, and 152, respectively, bases 124, 134, 144, and 154, respectively, and collectors 126, 136, 146, and 156, respectively. These active elements are connected between the positive power supply 20 and the negative power supply 22 in the following manner: a resistor 160 connects the negative supply 20 to the joined emitters 122 and 132, while the joined collectors 126 and 146 are connected to the positive power supply 22. The joined collectors 136 and 156 are directly coupled between the resistors 52 and 54 and to resistor 61 to provide stabilization current thereto.

The voltage level of the base 144 is maintained by voltage division between the power supply 20–22 in resistors 148 and 149. The voltage level of base 144 is compared with the voltage level of the base 154 which is maintained by voltage division in the resistors 158 and 159 between the negative power supply 20 and a point 162 between the emitters 102 and 112. Thus, the common-mode current flowing through transistor collectors 36 and 46 is well-regulated.

The point 162 is the focus of several networks which maintain circuit balance and stability. The diode 90 has already been mentioned. In addition, two diodes 160 and 170 and a resistor 174 are connected in series from the point 162 to between the resistors 58 and 59, with the like effect of temperature-stabilizing the common-mode voltage across the load resistors 58 and 59. Two series diodes are needed at 160 and 170 because they are in parallel with two series base-emitter junctions 74–72 and 104–102, and also with 84–82 in series with 114–112.

Beyond the second voltage gain stage 100–110, two current generator transistors 200 and 210, having emitters 202 and 212, bases 204 and 214, and collectors 206 and 216 cooperate with two dropping resistors 208 and 218 to shift the D.C. level downward for the transistors that follow. (If, as in the reduction to practice of FIGS. 1*a* and 1*b*, integrated circuitry is used, such dropping is necessary to maintain all transistors of the same polarity, NPN or PNP.) The emitters 202 and 212 of the current generators 200 and 210 are connected to the negative power supply 20 through resistors 203 and 213, respectively.

The signals from 106, 116 then pass through an emitter-follower stage 222–224 followed by a third voltage amplification stage 226–228. Only "one side" of the amplification stage 226–228 is used; that is to say, only the signals on the collector 229 of one transistor 228 are developed into an output. The output is developed by having a first emitter-follower transistor 230 feed current through a second emitter-follower transistor 232, the emitter 234 of which is directly connected to the output terminal 24.

The system represented at 300 will hereinafter be referred to as the drift-offset central circuitry 300. Its function is to supply currents to resistors 50, 52, 54, and 56 to compensate for inherent input temperature drift by two separate corrections: one correction to minimize the temperature-induced changes at that operating point (drift-control) and another correction to correct all the nontemperature-induced changes that have already occurred at that operating point (offset-control). The specific circuitry by which this is done is not essential to this invention.

The essential principles of the preferred embodiment described in connection with FIGS. 1*a* and 1*b* may best be understood by referring to FIG. 2. All circuitry beyond the collectors 36 and 46 is represented by the amplifier 500, which performs differential amplification, impedance coupling, and common-mode feedback functions to keep the amplifiers 30 and 40 at a constant operating circuit level and to drive signals through a high-level multiplexing network as represented at 502. The common-mode feedback circuit 504 carries currents derived by the Darlington circuit 57 from the voltage level between the output amplifiers 100 and 110, and its highly essential contribution is to stabilize the quiescent levels of the transistors 30 and 40. Thus stabilized, the transistors 30 and 40 respond with great precision to the difference in voltage between the input terminal 10 and the input terminal 12.

Thus applicant has provided a differential comparator circuit which permits low level comparison of very small differential input signals, before the errors inherent in amplification and multiplexing can appear. After differential comparison, the digitized comparison information is not subject to the inaccuracies that degraded analog input signals in prior art systems, which amplified and multiplexed the analog inputs before comparing them.

I claim:

1. In combination for comparing a first electrical signal on a first input terminal with second electrical signal on a second input terminal, a first transistor having emitter, base, and collector, the base of the first transistor being connected to the first input terminal, a second transistor having emitter, base, and collector, the base of the second transistor being connected to the second input terminal, at least one common mode amplification stage connected to the collector of the first transistor and to the collector of the second transistor, a first reference voltage terminal, a second reference voltage terminal, first, second, third, and fourth resistors all connected in series with one another, said first resistor being connected to said first reference voltage terminal and said fourth resistor being connected to said second reference voltage terminal, means connecting the emitter of the first transistor to a point between the first resistor and the second resistor, means connecting the emitter of the second transistor between the third resistor and the fourth resistor, a feedback connected between said common mode amplification stage and a point between said second resistor and said third resistor, and a drift-offset control network connected to the emitter of the first transistor and the emitter of the second transistor.

References Cited

UNITED STATES PATENTS

| | | | |
|---|---|---|---|
| 3,168,709 | 2/1965 | Sikorra | 330—69 X |
| 3,247,462 | 4/1966 | Kobbe | 330—69 X |
| 3,328,599 | 6/1967 | Stupar | 328—146 |
| 3,346,817 | 10/1967 | Walker et al. | 330—69 X |

JOHN S. HEYMAN, Primary Examiner

R. C. WOODBRIDGE, Assistant Examiner

U.S. Cl. X.R.

328—115, 146, 150; 330—30, 69